United States Patent
Fukaya et al.

(10) Patent No.: US 8,440,545 B2
(45) Date of Patent: May 14, 2013

(54) METHOD OF MANUFACTURING SEMICONDUCTOR DEVICE WITH SPRAYING FLUID

(75) Inventors: Hironori Fukaya, Kawasaki (JP); Yuzo Shimobeppu, Kawasaki (JP); Kazuhiro Yoshimoto, Kawasaki (JP); Yoshiaki Shinjo, Kawasaki (JP); Kazuo Teshirogi, Kawasaki (JP); Mika Sakamoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 495 days.

(21) Appl. No.: 12/273,009

(22) Filed: Nov. 18, 2008

(65) Prior Publication Data

US 2009/0239355 A1 Sep. 24, 2009

(30) Foreign Application Priority Data

Mar. 24, 2008 (JP) .................................. 2008-76684

(51) Int. Cl.
*H01L 21/00* (2006.01)
(52) U.S. Cl.
USPC .................... 438/465; 438/463; 257/E21.214
(58) Field of Classification Search .......... 438/460–465; 257/E21.214
See application file for complete search history.

(56) References Cited

U.S. PATENT DOCUMENTS

| 6,071,576 A * | 6/2000 | Bentmar et al. ............. 428/34.2 |
| 2003/0170417 A1* | 9/2003 | Saito et al. ................... 428/66.6 |
| 2005/0192193 A1* | 9/2005 | Korzenski et al. ............. 510/175 |
| 2005/0277270 A1 | 12/2005 | Yoshikawa et al. |
| 2006/0105544 A1 | 5/2006 | Takanashi et al. |
| 2007/0187036 A1 | 8/2007 | Ametani |
| 2007/0224811 A1* | 9/2007 | Wang et al. ................... 438/678 |
| 2008/0076233 A1* | 3/2008 | Morishige et al. ............ 438/463 |
| 2011/0091789 A1* | 4/2011 | Mofakhami et al. .......... 429/482 |

FOREIGN PATENT DOCUMENTS

| JP | 2005-353935 A | 12/2005 |
| JP | 2006-140311 A | 6/2006 |
| JP | 2007-214496 A | 8/2007 |

\* cited by examiner

*Primary Examiner* — David Vu
*Assistant Examiner* — Duy T Nguyen
(74) *Attorney, Agent, or Firm* — Westerman, Hattori, Daniels & Adrian, LLP

(57) ABSTRACT

A method of manufacturing a semiconductor device includes spraying fluid onto a surface of a treatment target substrate including a semiconductor substrate; forming a protection layer on the surface of the treatment target substrate after spraying the fluid; selectively removing the protection layer and a part of the treatment target substrate by an energy beam; and conducting removal processing on an area of the treatment target substrate from which the protection layer and the part of the treatment target substrate are selectively removed.

14 Claims, 23 Drawing Sheets

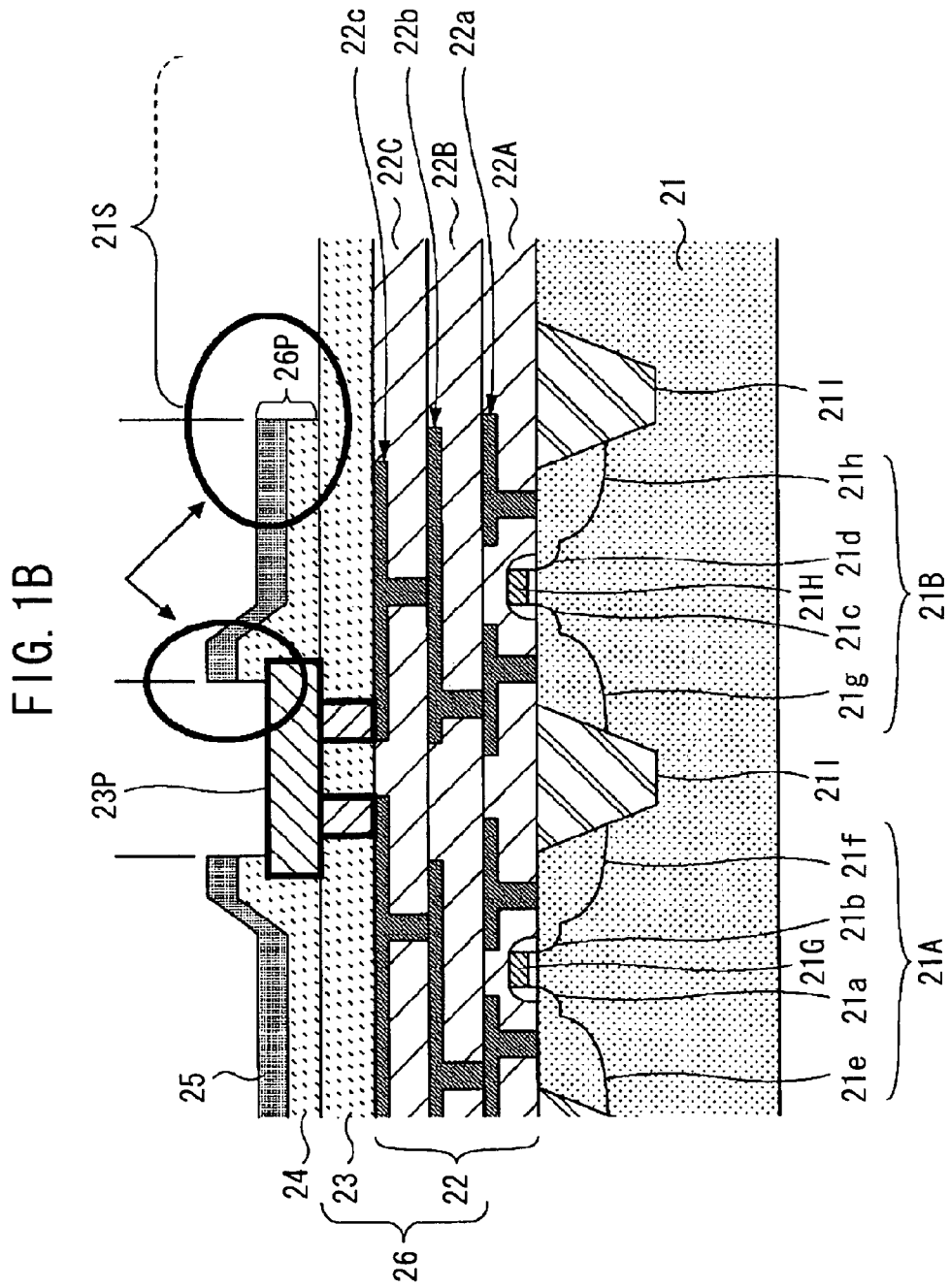

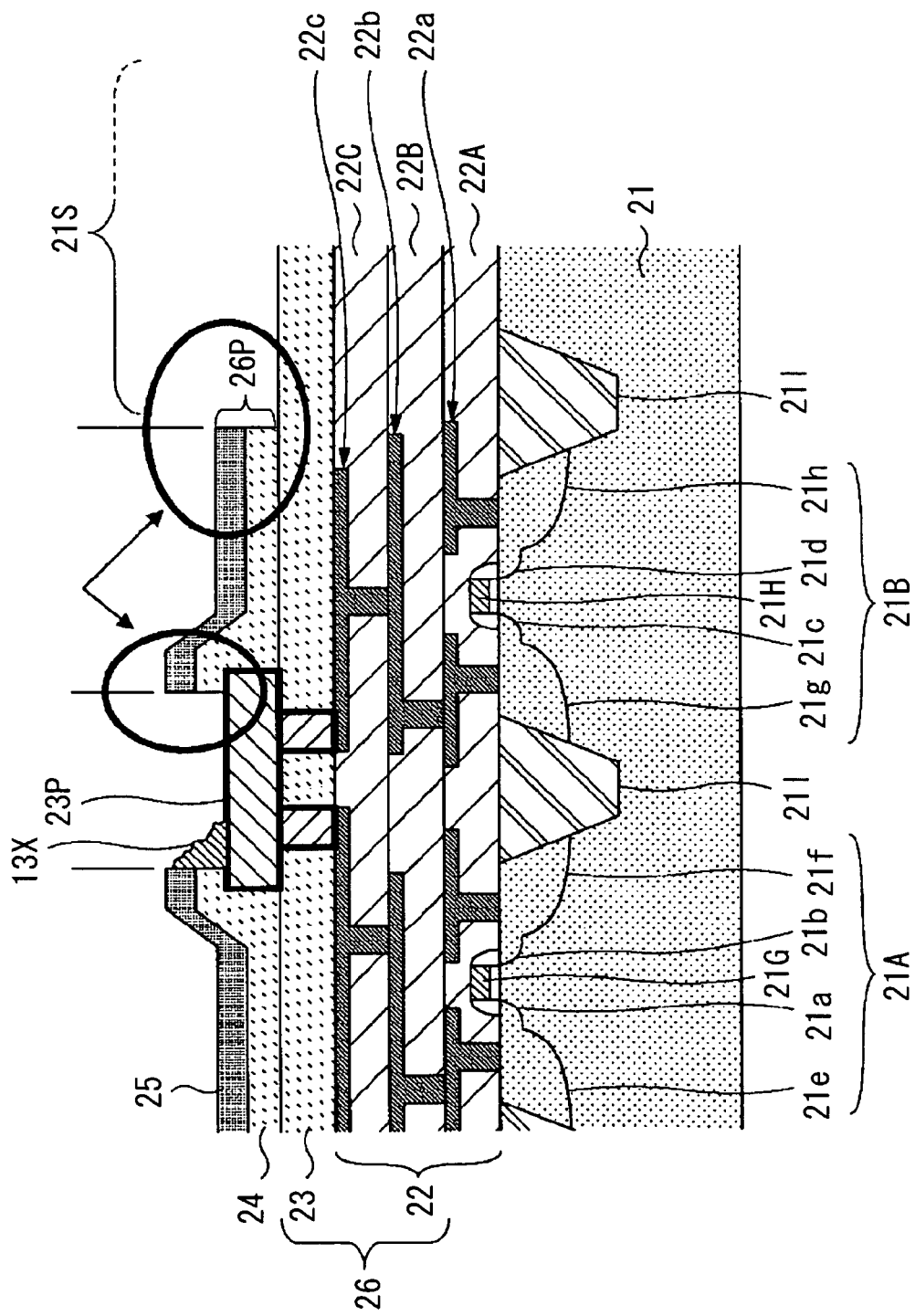

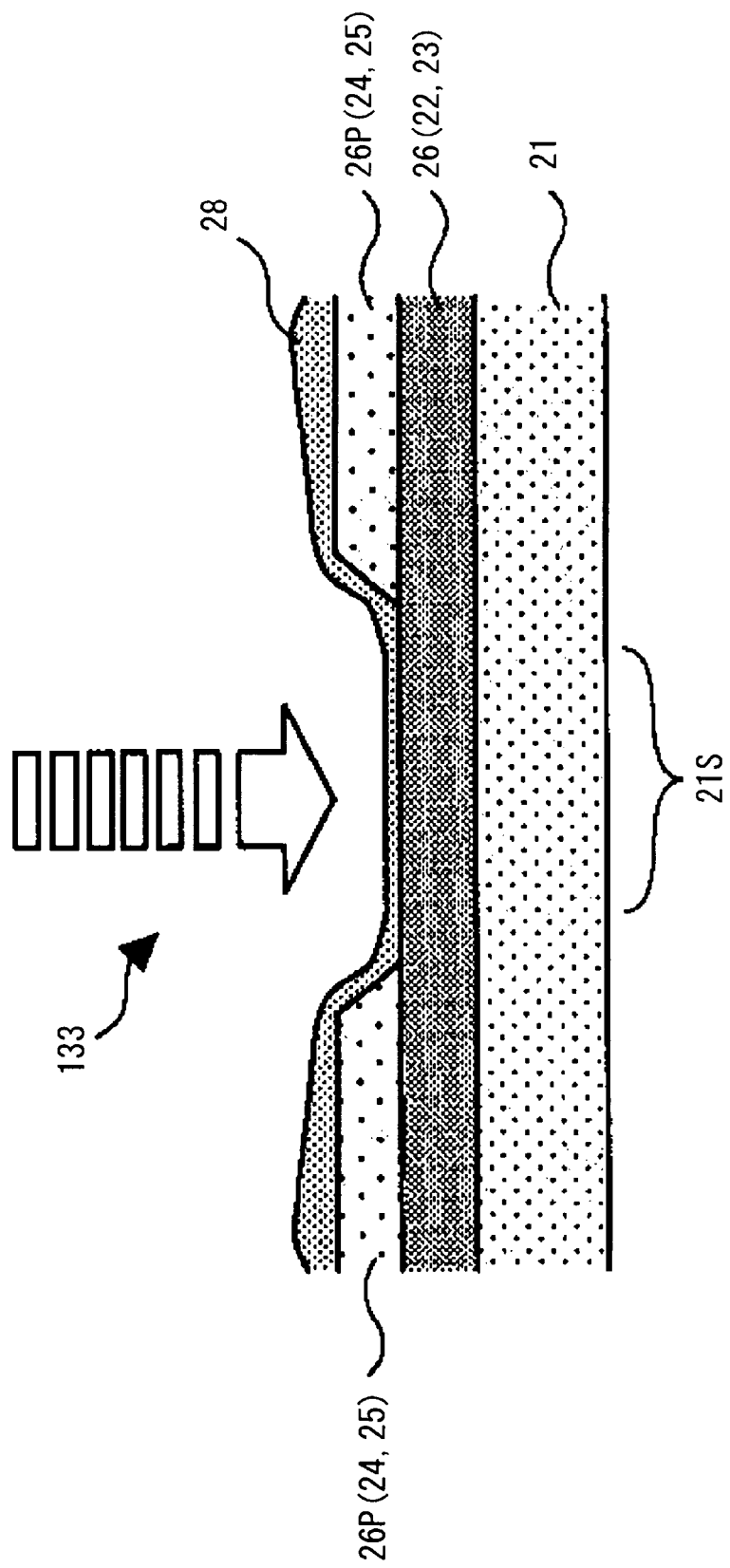

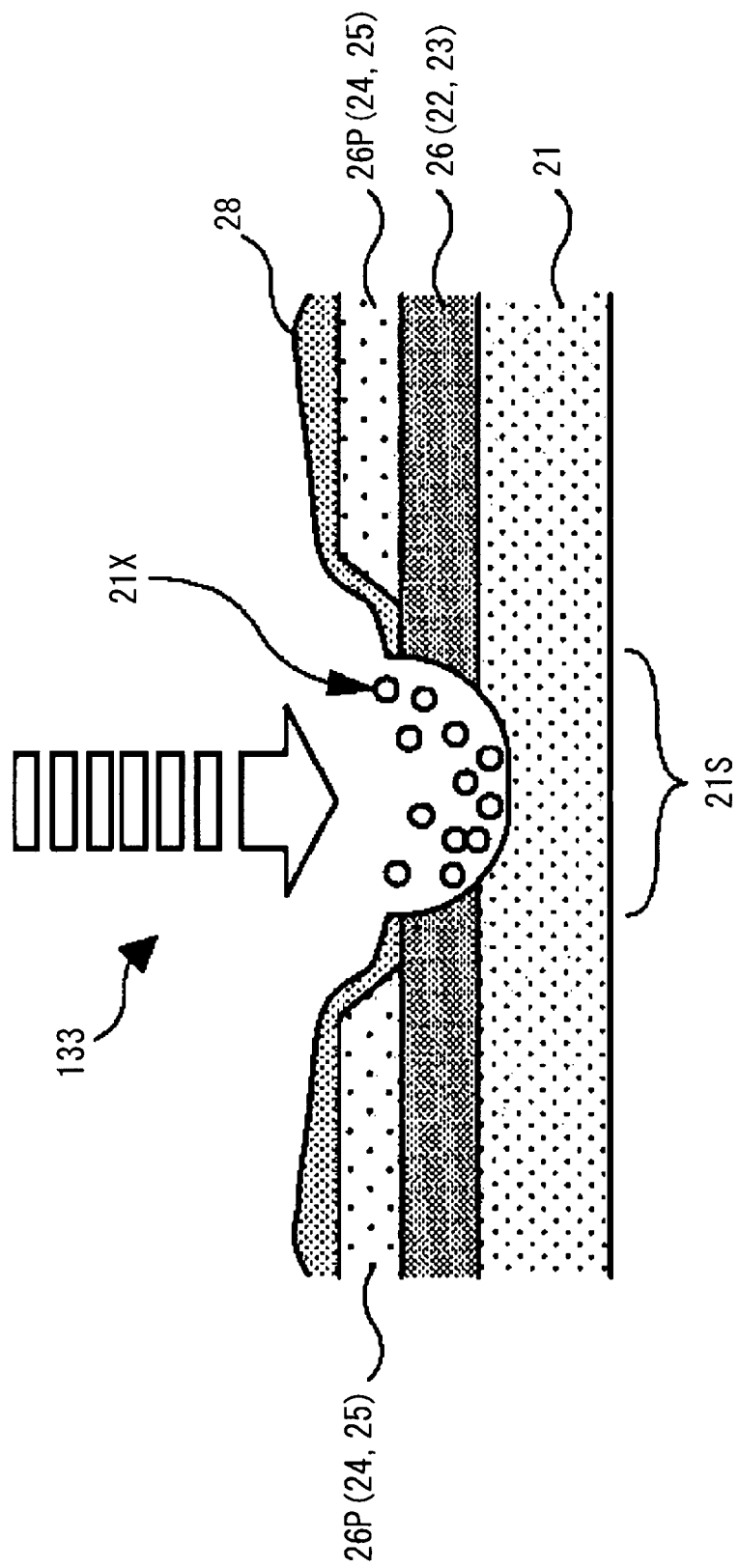

METHOD OF MANUFACTURING SEMICONDUCTOR DEVICE WITH SPRAYING FLUID

CROSS-REFERENCE TO RELATED APPLICATIONS

This application is based upon and claims the benefit of priority of Japanese Patent Application No. 2008-76684, filed on Mar. 24, 2008, the entire contents of which are incorporated herein by reference.

FIELD

The embodiment discussed herein is directed to a method of manufacturing a semiconductor device in which a semiconductor substrate is processed using an energy beam.

BACKGROUND

JP-A-2006-140311 discloses a technique of forming a polyvinyl alcohol (PVA) film on the surface of a semiconductor substrate before the semiconductor substrate is diced by a laser beam. The polyvinyl alcohol film serves as a protection film for preventing foreign materials which occur in the dicing process from adhering to the semiconductor substrate. Accordingly, the polyvinyl alcohol film as well as the foreign materials adhering to the semiconductor substrate are removed by water washing.

SUMMARY

According to an aspect of the embodiment, a method of manufacturing a semiconductor device includes steps of: spraying fluid onto a surface of a treatment target substrate including a semiconductor substrate; forming a protection layer on the surface of the treatment target substrate after spraying the fluid; selectively removing the protection layer and a part of the treatment target substrate by an energy beam; and conducting removal processing on an area of the treatment target substrate from which the protection layer and the part of the treatment target substrate are selectively removed.

BRIEF DESCRIPTION OF DRAWINGS

FIG. 1B is a cross-sectional view showing the construction of a semiconductor device formed in one semiconductor element area in the construction shown in FIG. 1A;

FIGS. 2A to 2M are diagrams showing a method of manufacturing a semiconductor device according to the embodiment;

FIG. 3 is a diagram showing one problem point to be solved by the embodiment;

FIGS. 5A to 5E are cross-sectional views showing the details of the process described with reference to FIGS. 2K to 2L.

DESCRIPTION OF EMBODIMENT

Figure 1A:
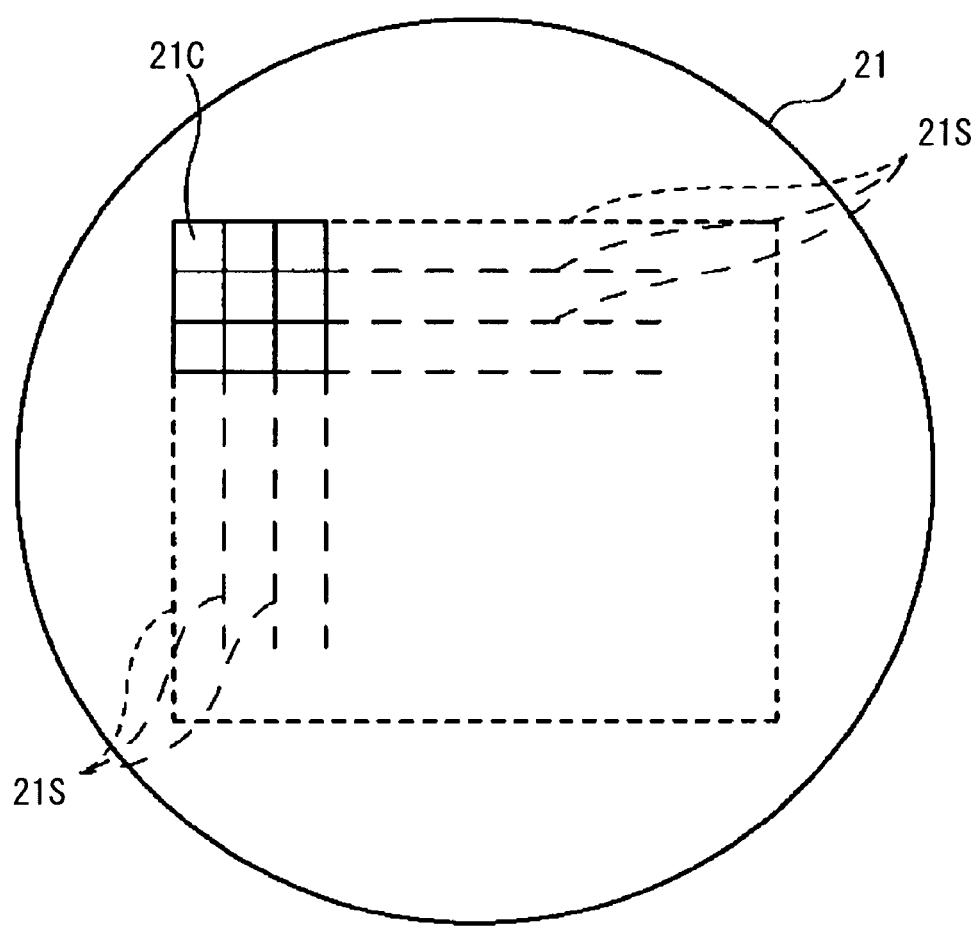
FIG. 1A is a plan view showing a substrate used in an embodiment.

A semiconductor substrate 21 to be treated in an embodiment is shown in FIG. 1A.

The semiconductor substrate 21 is a silicon (Si) substrate of 300 mm in diameter, and plural semiconductor elements 21C are arranged in a matrix form compartmented by scribe lines 21S.

Each of the semiconductor elements 21C is a semiconductor element containing an MIS type transistor, and it has a cross-sectional structure shown in FIG. 1B.

That is, in the semiconductor element area, element areas 21A and 21B are compartmented by an element separation area 21I having a shallow trench insulating separation (STI) structure. In the element area 21A, a gate electrode 21G is disposed through a gate insulating film on the semiconductor substrate 21. LDD areas 21a, 21b are formed at both the sides of the gate electrode 21G. A source area 21e and a drain area 21f are formed at the outside of the LDD area. That is, an MIS type transistor is formed in the semiconductor element area. An MIS type transistor is also formed in the other element area 21B with the same construction.

Layer-insulating films 22A, 22B and 22C of an aromatic organic polymer film such as trade name SiLK (registered trademark of Dow Chemical Company), Flare (registered trademark of Honeywell, Inc.) or the like, or a porous film thereof are laminated on the semiconductor substrate 21.

A wire layer 22a formed of a copper (Cu) wire having a damascene structure or dual damascene structure is disposed in the interlayer insulating film 22A. The wire layer concerned is connected to the source areas 21e, 21g or the drain areas 21f, 21h by a via plug.

Likewise, a wire layer 22b formed of a copper wire having a damascene structure or dual damascene structure is disposed in the interlayer insulating film 21B. The wire layer 22b is connected to the wire layer 22a through a via plug. A wire layer 22c formed of a copper wire having a damascene structure or a dual damascene structure is disposed in the interlayer insulating film 21C. The wire layer 22c is connected to the wire layer 22b by a via plug. These wire layers mutually connect active elements such as the MIS transistor, etc. and passive elements such as a capacitance element (not shown), a resistance element, etc. Therefore, a multilayered wire structure 22 is formed on the semiconductor substrate 21.

A first passivation film 23 formed of silicon oxide ($SiO_2$) or silicon nitride (SiN) is disposed on the interlayer insulating film 22C in the multilayered wire structure 22 described above. A contact pad 23P formed of aluminum (Al) or the like which is connected to the wire layer 23c is disposed on the passivation film 23.

Furthermore, a second passivation film 24 formed of silicon nitride is disposed on the passivation film 23 so as to cover the contact pad 23P. A third passivation film 25 formed of polyimide is disposed on the passivation film 24.

The passivation films 24, 25 concerned are subjected to patterning so that the contact pad 23P is exposed and also the first passivation film 23 is exposed in the scribe area 21S.

In the following description, the semiconductor elements are represented by reference numerals "21A", "21B" representing the element areas, respectively.

In the semiconductor element having the construction described above, a step portion is formed around the electrode pad 23P and along the scribe area 21S at the site surrounded by an ellipse in FIG. 1B. Accordingly, residue of adhesive agent of a tape (for example BG tape) may occur in the semiconductor substrate 21.

A semiconductor device manufacturing method according to this embodiment which is applied to the semiconductor substrate 21 as described above will be described with reference to FIGS. 2A to 2M.

As described above, the semiconductor elements 21A and 21B are formed on the semiconductor substrate 21. The multilayered wire structure portion 26 containing the multilayered wire structure 22, the passivation films 23 to 25 and the electrode pad 23P is formed on the semiconductor substrate 21.

Figure 2A:
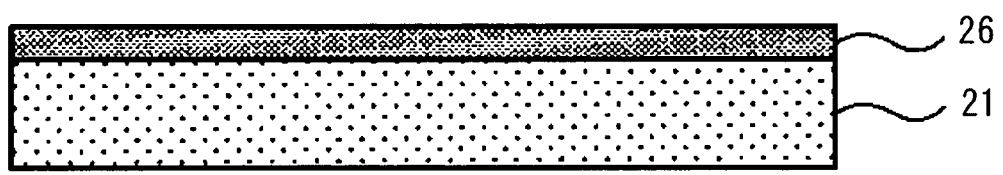

In FIG. 2A, the detailed illustrations of these function elements, the multilayered wire structure and the passivation films are omitted, and only the semiconductor substrate 21 and the multilayered wire structure portion 26 are illustrated.

Figure 2B:
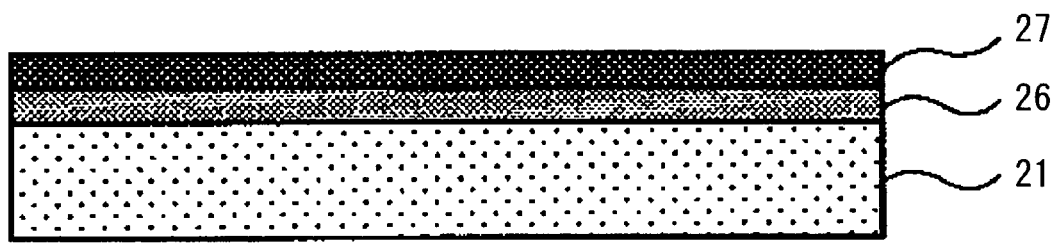

First, when a dicing treatment is conducted on the semiconductor substrate 21, a surface protection tape 27 is first disposed so as to cover the multilayered wire structure portion 26 on the semiconductor substrate 21 (see FIG. 2B).

A tape sold as a trade name F-90MW from ToyoADEC company may be applied as the surface protection tape 27.

Figure 2C:
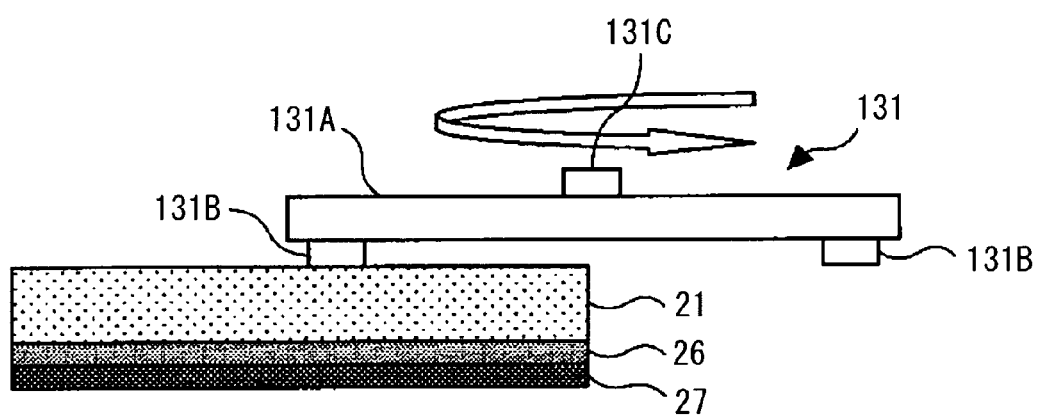
Figure 2D:
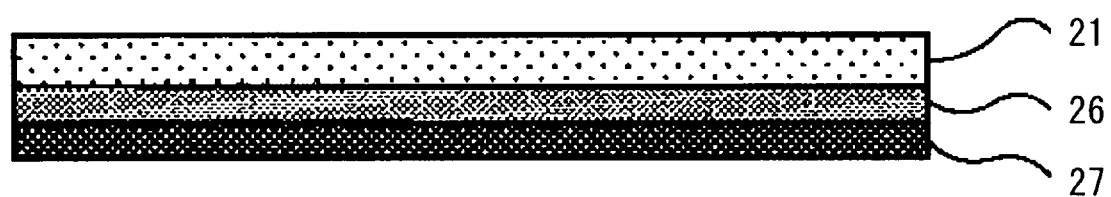

Next, the semiconductor substrate 21 is mounted in a polishing apparatus 131 with the back surface of the semiconductor substrate 21 placed face up (as an exposed surface), and the back surface of the semiconductor substrate 21 is polished (see FIG. 2C).

In the polishing apparatus 131, a polishing grind stone 131B is mounted on a polishing head 131A rotating around a shaft 131c. The back surface of the semiconductor substrate 21 is polished by the grind stone 131B. The polishing treatment is executed by a predetermined amount, whereby the thickness of the semiconductor substrate 21 is reduced to a predetermined thickness (see FIG. 2C). The back surface polishing described above is executed till the thickness of the semiconductor substrate 21 as the treatment target is set to a predetermined value, for example, 600 µm in thickness (see FIG. 2D).

Figure 2E:

When the thickness of the semiconductor substrate 21 reaches the predetermined value, the polishing treatment is finished, and the surface protection tape 27 is removed (see FIG. 2E).

Figure 2F:
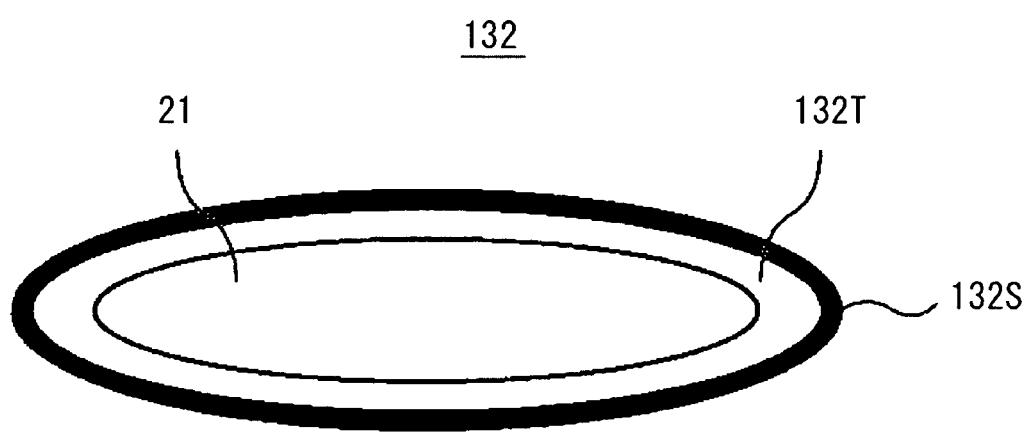

Subsequently, the semiconductor substrate 21 is mounted on a rotational table 132S of a spin coating apparatus 132 through a dicing tape 132T with the semiconductor element forming surface of the semiconductor substrate 21 placed face up (see FIG. 2F).

Figure 2G:
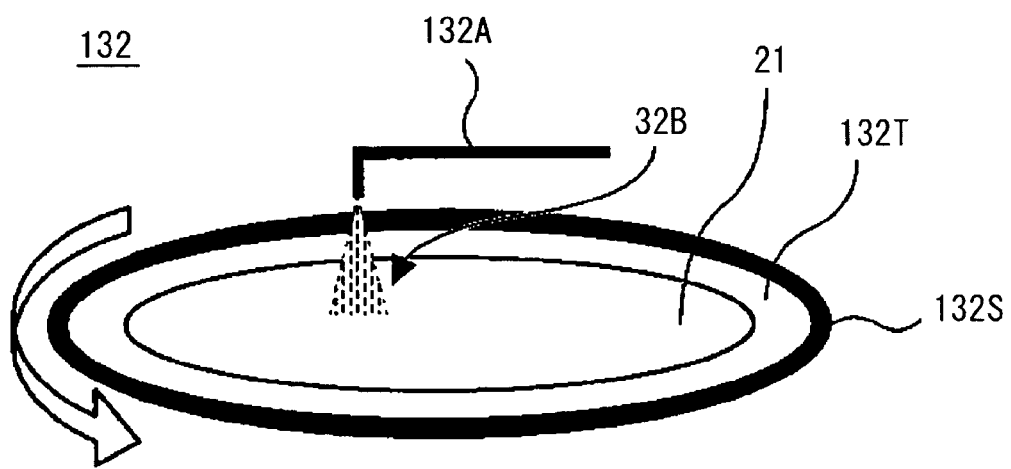

According to this embodiment, under the above state, pure water, mixture fluid of pure water and air or polyvinyl alcohol diluted with pure water is injected in the form of a jet 32B from a nozzle 132A while the rotational table 132S is rotated at 100 to 2000 rpm, preferably at 500 rpm, thereby cleaning the surface of the semiconductor substrate 21 (see FIG. 2G). The jet pressure is set to 0.01 to 0.5 MPa, preferably 0.05 MPa. The flow rate of the jetting is set to 10 to 3000 ml/minute, preferably 300 ml/minute.

This jet washes and cleans the foreign materials and the residue of the adhesive agent which adhere to the multilayered wire structure portion 26 on the semiconductor substrate 21 in the above process. At this time, the semiconductor substrate 21 rotates, and thus the removal of the foreign materials concerned and the residue of the adhesive agent is also promoted by the centrifugal force generated by the rotation of the semiconductor substrate 21.

As described above, by the washing treatment described above, foreign materials and impurities are removed from the surface of the contact pad 26P, and even when a wire bonding treatment is conducted in the subsequent step, stable bonding wire connection can be obtained. Furthermore, exfoliation of the bonding wire can be avoided.

Spray of the jet 32B requires only a time for which the surface of the semiconductor substrate 21 is once scanned by the nozzle 132A (one-pass time), for example, five seconds. Furthermore, at this time, the nozzle 132A may be properly swung.

Figure 2H:
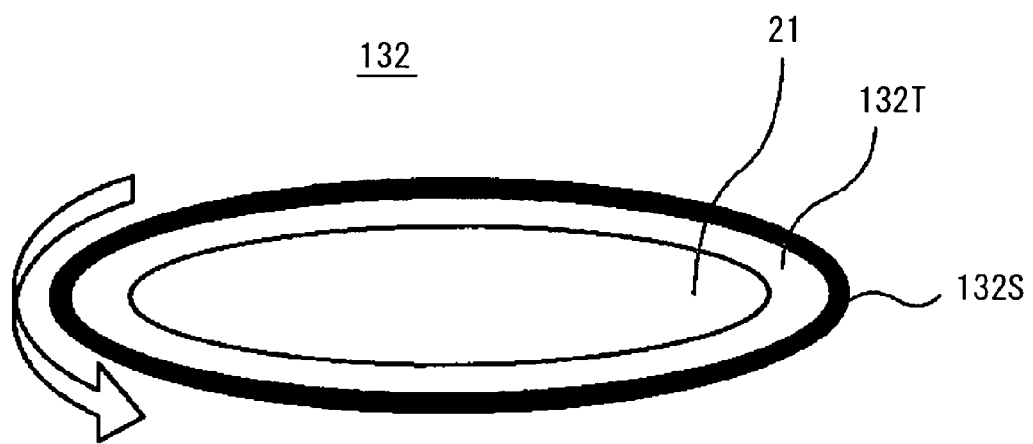
Figure 21:
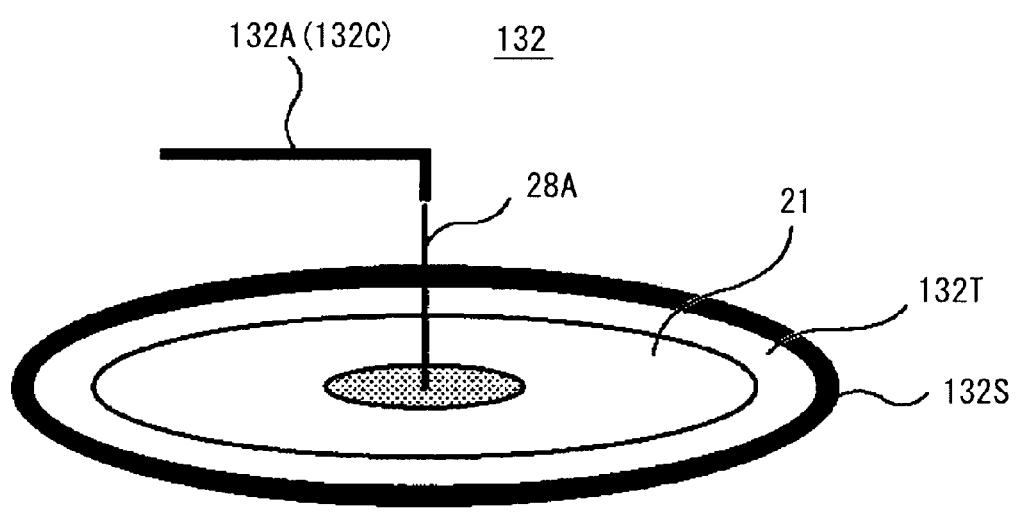
Figure 2J:
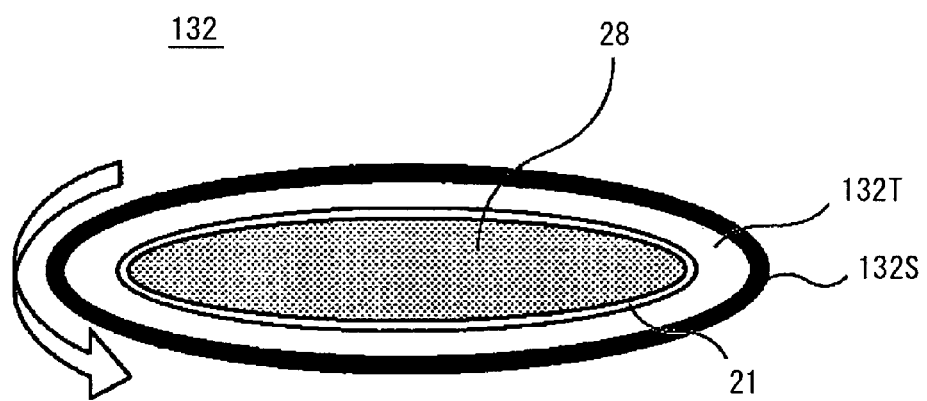

After the washing treatment described above, the rotational table 132S is continuously rotated, whereby the semiconductor substrate 21 is rotated for about 5 to 30 seconds and water components adhering to the semiconductor substrate 21 are removed (see FIG. 2H).

Subsequently, the rotation of the rotational table 132S of the spin coating apparatus 132 is stopped, and under this state, polyvinyl alcohol water solution 28A of 10 to 500 g/cm³ in concentration is dropped to the substantially center portion of the semiconductor substrate 21 from the nozzle 132A or another nozzle 132C (see FIG. 2I).

Thereafter, the rotational table 132S is rotated at 100 to 2000 rpm, preferably at 500 rpm together with the semiconductor substrate 21, whereby the polyvinyl alcohol liquid 28A spreads in the outer peripheral direction of the semiconductor substrate 21.

At this time, the foreign materials on the multilayered wire structure portion 26 are removed by the spray of the jet 32B as described above, and thus the polyvinyl alcohol water solution 28A spreads in the outer peripheral direction of the semiconductor substrate 21 while the thickness is uniform.

Furthermore, the polyvinyl alcohol water solution 28A spreads so as to cover the step portion existing on the surface of the semiconductor substrate 21.

The polyvinyl alcohol liquid 28A forms the polyvinyl alcohol (PVA) film 28 of about 0.3 µm in thickness on the semiconductor substrate 21 (see FIG. 2J) after it is dried.

Figure 2K:
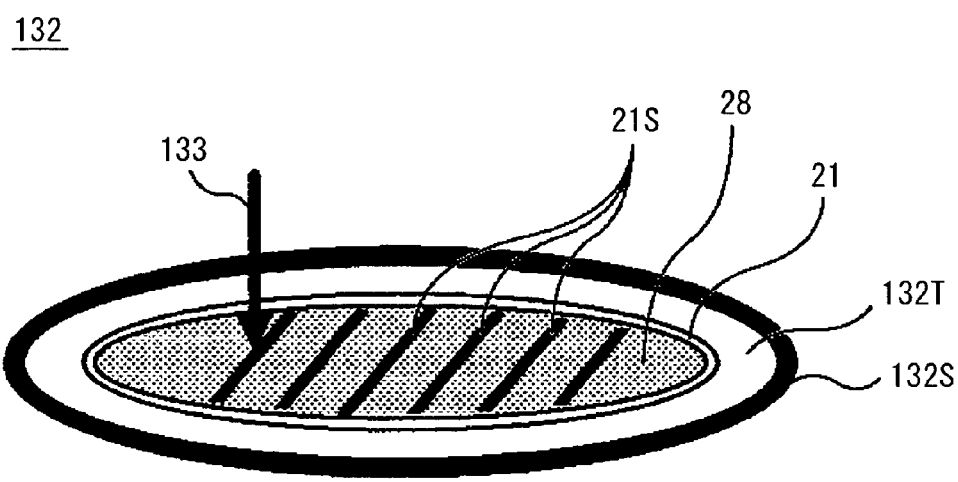

Subsequently, the PVA film 28 on the scribe area 21S is selectively irradiated with a laser beam 133 to selectively remove the PVA film 28 in the scribe area 21S and the multilayered wire structure portion 26 located below the PVA film 28 (see FIG. 2K). For example a $YVO_4$ laser is applied as the laser. The laser power is set in the range from 0.3 to 4.0 W.

Figure 2L:
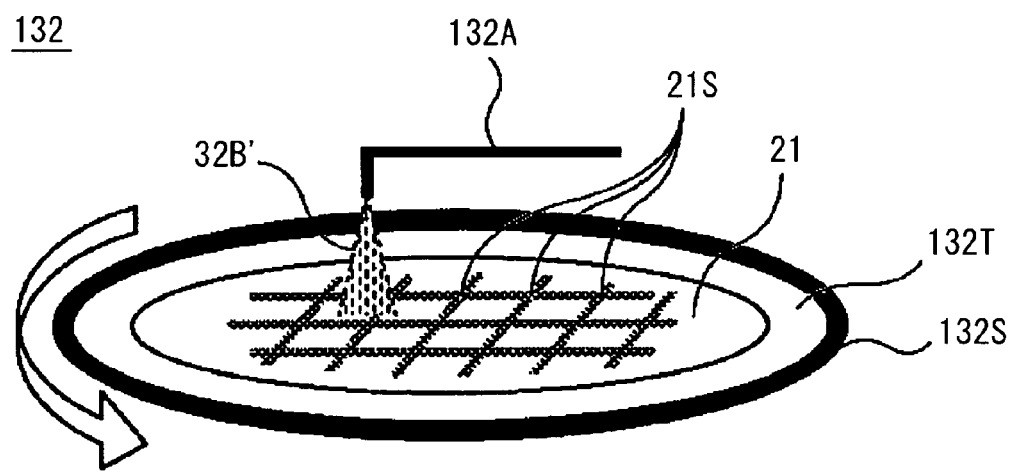
Figure 2M:
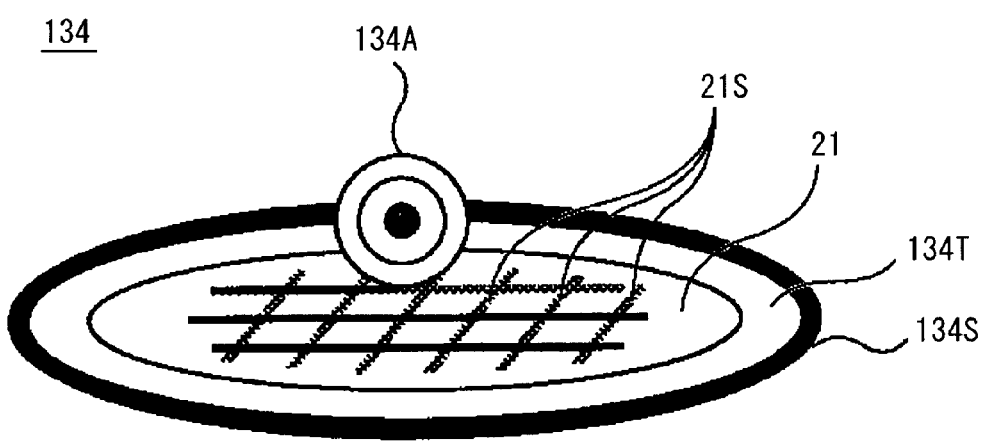

Subsequently, pure water, the mixture of pure water and air or PVA diluted with pure water is sprayed in the form of jet 32B' from the nozzle 132A onto the semiconductor substrate 21 while the rotational table 132S is rotated at the rotating speed of 100 to 2000 rpm, preferably 500 rpm together with the semiconductor substrate 21, thereby cleaning the surface of the semiconductor substrate 21 (see FIG. 2L). The spray pressure is set to 0.01 to 0.5 MPa, preferably to 0.5 MPa. The flow rate of the spray is set to 10 to 3000 ml/minute, preferably to 300 ml/minute. The spray time is set to about 120 seconds. The nozzle 132A may be repetitively scanned on the substrate 21 during the spraying step.

Thereafter, the semiconductor substrate 21 is mounted onto a table 134S of a dicing apparatus 134 through a dicing tape 134T. The semiconductor substrate 21 is cut along scribe lines in the scribe areas 21S by using a dicing blade 134A, whereby the semiconductor substrate 21 are separated and segmentalized into individual semiconductor elements (see FIG. 2M).

In this embodiment having the process as described above, fluid 32B is sprayed onto the semiconductor substrate 21 before the surface protection layer 28 is formed on the semiconductor substrate 21. Accordingly, foreign materials which exist on the surface of the multilayered wire structure portion 26 and disturb the formation of the surface protection layer 28 at a uniform thickness are blown out. Alternatively, the foreign materials are partially dissolved and removed by the fluid 32B.

For example, even when foreign materials such as adhesive agent residue 13X or the like remains at the step portion on the semiconductor substrate 21 as shown in FIG. 3, the foreign materials concerned are removed by the cleaning treatment described above.

Figure 4A:
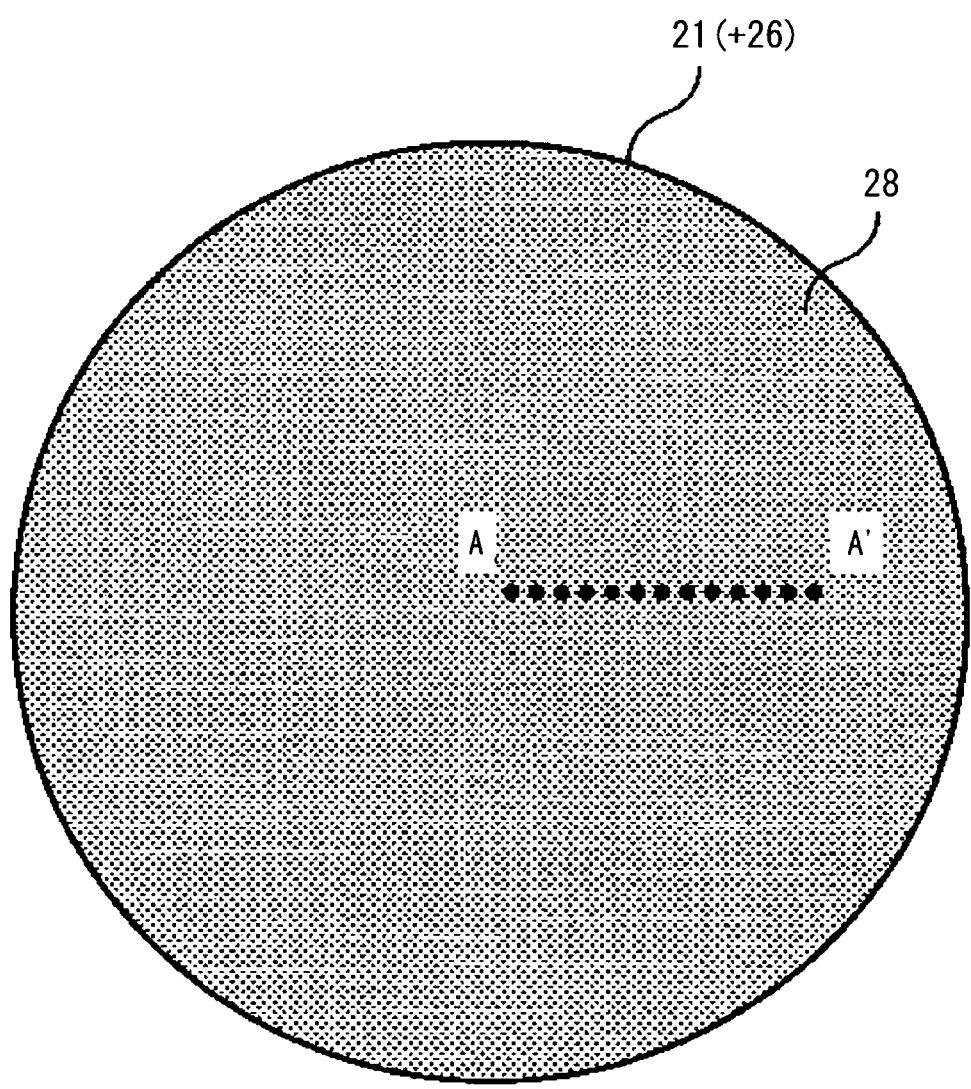
FIG. 4A is a plan view showing a state of the semiconductor substrate obtained by the embodiment.
Figure 4B:
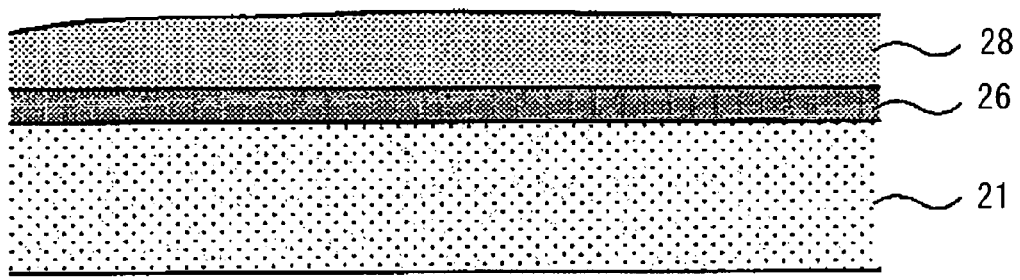
FIG. 4B is a cross-sectional view showing a state of the semiconductor substrate obtained by the embodiment.

Accordingly, the surface protection layer 28 can be formed at a substantially uniform thickness on the semiconductor substrate 21 (see FIGS. 4A, 4B). FIG. 4A is a plan view showing the state of the semiconductor substrate obtained by this embodiment, and FIG. 4B is a cross-sectional view taken along A-A' in FIG. 4A. The line A-A' corresponds to the scribe line in the semiconductor substrate 21.

FIGS. 5A to 5E show a grooving process based on a laser beam onto the semiconductor substrate 21 having the surface protection layer 28 formed at a substantially uniform thickness as described above.

A passivation structure 26P containing passivation films 24, 25 of polyimide or the like is formed on the multilayered wire structure portion 26 on the surface of the semiconductor substrate 21 while the scribe area 21S remains. The PVA film 28 constituting the surface protection layer is disposed so as to cover the passivation structure 26P and the scribe area 21S (see FIG. 5A).

The scribe area 21S is selectively irradiated with a laser beam 133 (see FIG. 5B). The irradiation of the laser beam 133 removes the multilayered wire structure portion 26 in the scribe area 21S together with the PVA film 28 (see FIG. 5C).

Figure 5A:
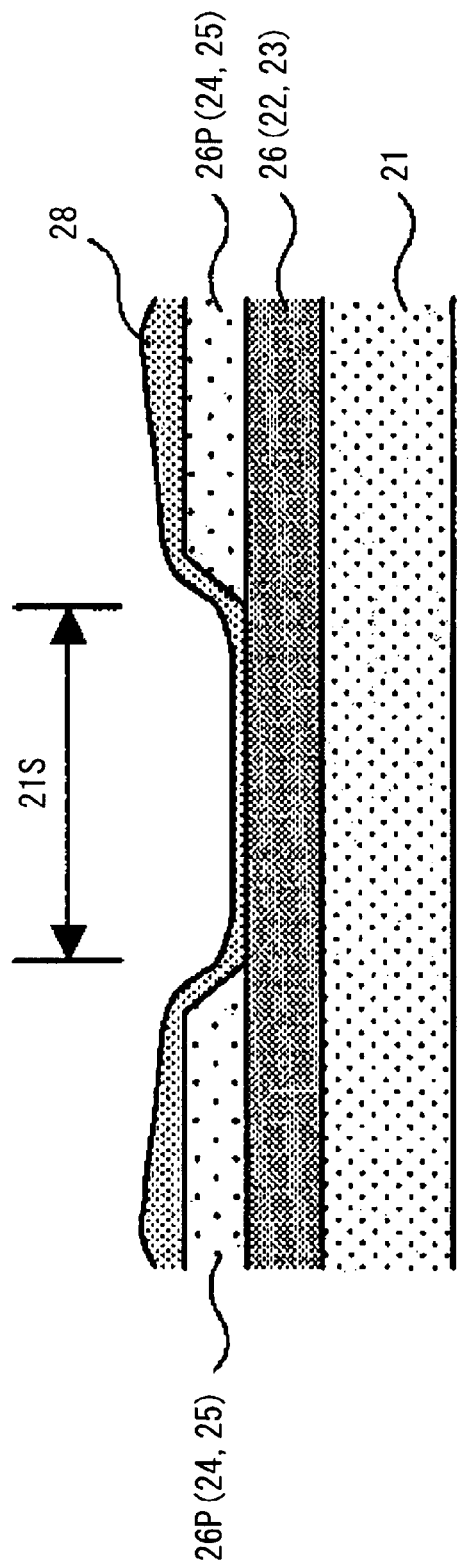
Figure 5D:
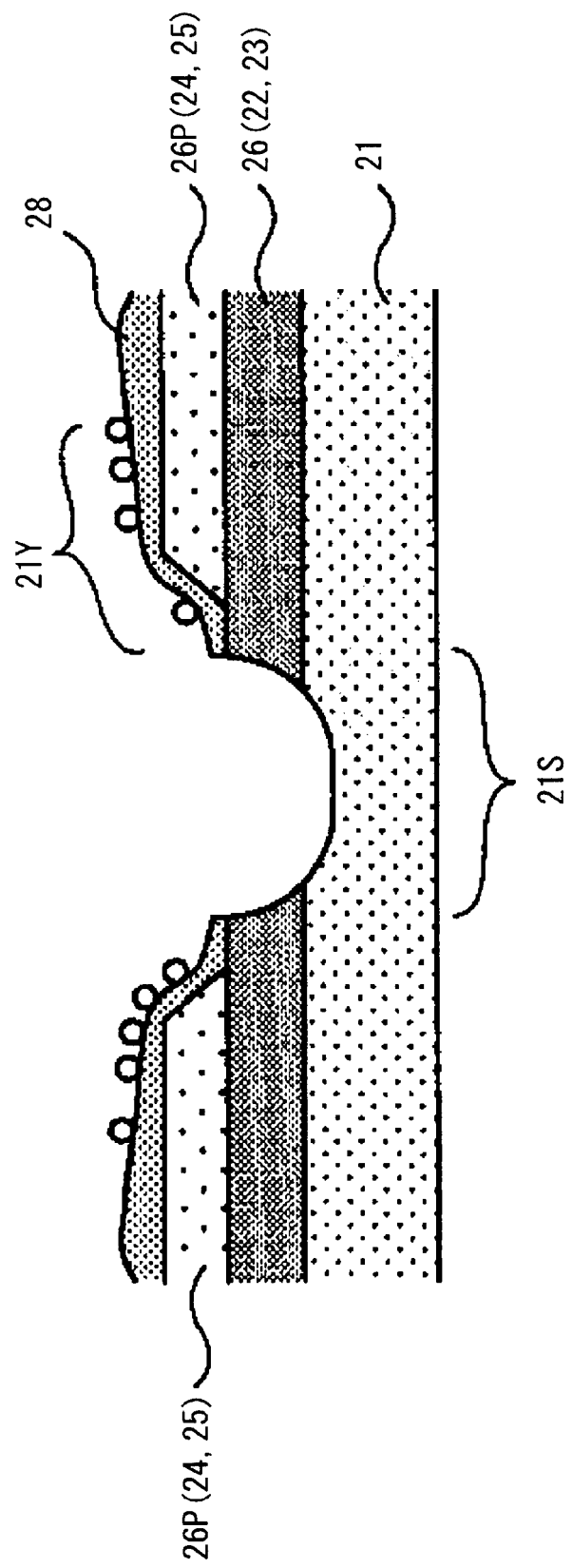
Figure 5E:
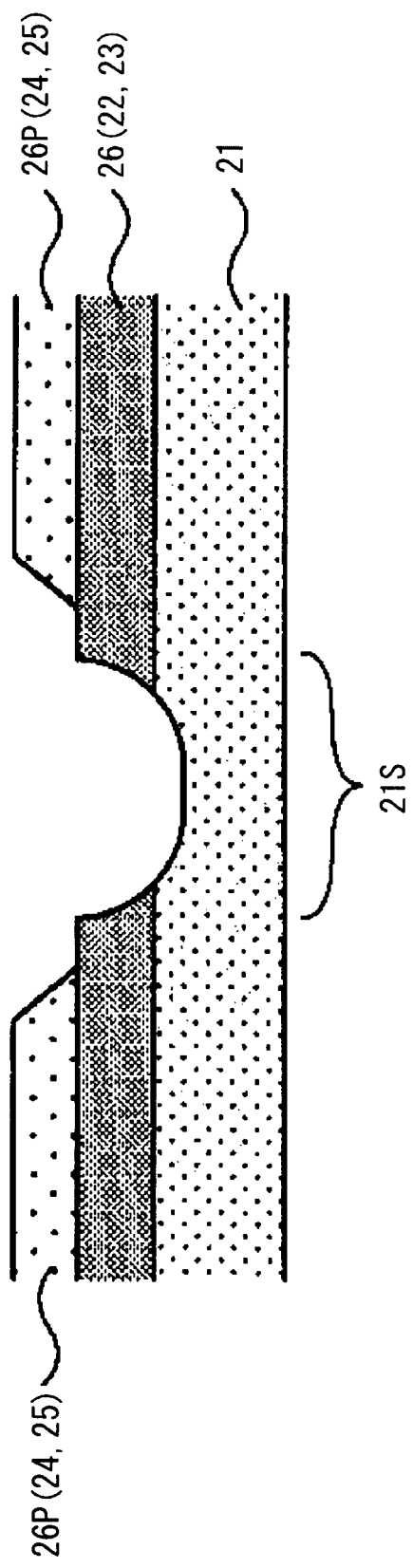

At this time, there is a case where sublimated material 21X is generated by the laser irradiation and the sublimated material 21X agglutinates again to induce foreign materials 21Y on the PVA film 28 at least around the scribe area 21S (see FIG. 5D).

However, the PVA film 28 containing the surrounding of the scribe area 21S is coated at the substantially uniform thickness as described above. Accordingly, the foreign material 21Y is prevented from invading through the PVA film 28 and reaching the passivation structure 26P. Accordingly, in the step of removing the PVA layer 28 by water cleaning, the foreign material 21Y is also removed together with the PVA film 28, and a structure having a cleaned surface containing no foreign material is obtained (see FIG. 5E).

By adopting the manufacturing process as described above, the manufacturing yield can be more greatly improved as compared with the conventional manufacturing method.

As described above, the PVA film is applied as the surface protection layer 28, and the spin coating method of polyvinyl alcohol liquid is used to form the surface protection layer 28.

During the spin coating, the polyvinyl alcohol concerned is coated at a uniform thickness on the surface of the multilayered wire structure portion 26, and it continuously or partially continuously spreads while transmitting along remaining island-shaped pure films. Accordingly, even when unevenness exists on the surface of the multilayered wire structure portion 26, polyvinyl alcohol can be uniformly coated at a desired thickness.

The polyvinyl alcohol concerned is an inexpensive water-soluble film, and it is suitable for film formation based on the spin coating method. Furthermore, it can be easily removed by cleaning. Therefore, polyvinyl alcohol is suitably used to remove foreign materials occurring when the grooving processing using the laser beam is carried out.

The surface protection layer 28 comprising the PVA film is preferably formed at a thickness of 0.2 to 0.4 μm. Since the surface protection layer 28 is formed at the film thickness described above, even when foreign materials occurring in the grooving processing based on the laser beam scatter, these foreign materials are avoided from invading into the multilayered wire structure portion 26 below the surface protection layer 28.

Furthermore, the cleaning of the surface of the semiconductor substrate 21 which is carried out before the coating of polyvinyl alcohol liquid is executed by applying jet of pure water to the surface of the semiconductor substrate 21 containing the multilayered wire structure portion 26.

The water is a material used as solvent for polyvinyl alcohol. Therefore, by applying pure water as the fluid 32B, the polyvinyl alcohol liquid 28A can continuously or partially continuously quickly spread to the surface of the multilayered structure portion 26 while transmitting along the remaining island-shaped pure water films.

Even when unevenness exists on the surface of the multilayered wire structure 26, the surface of the multilayered wire structure portion 26 can be uniformly coated by the PVA film 28 having a desired thickness.

Furthermore, the spray of the fluid 32B may be executed by applying jet of the mixture of pure water and gas such as air. By using the jet of pure water and air, the cleaning can be performed in low cost.

For example, by supplying pure water together with pressurized air while rotating the semiconductor substrate 21, the foreign materials can be blown out without damaging the surface of the multilayered wire structure portion 26.

Furthermore, the spray of the fluid 32B may be performed by using polyvinyl alcohol liquid of low concentration in place of the water (pure water). That is, the concentration of the polyvinyl alcohol is set to a lower value than the concentration of polyvinyl alcohol applied to form the surface protection layer 28.

In this case, the polyvinyl alcohol liquid is diluted and thus it has low viscosity. Therefore, the jet 32B has energy enough to blow out the foreign materials on the surface of the multilayered wire structure portion 26, and also even when a step portion exits on the surface of the multilayered wire structure portion 26, the jet 32B spreads beyond the step portion, whereby the surface of the multilayered wire structure portion 26 can be uniformly cleaned.

As described above, when the polyvinyl alcohol liquid is applied as the fluid 32B, the dilution of polyvinyl alcohol is carried out at a dilution rate of at least three times, more preferably ten times or more. The viscosity of PVA diluted by three times is equal to about 20 cp, and the viscosity of PVA diluted by ten times is equal to about 6 cp, so that it has the same level fluidity as water (pure water).

The coating of the polyvinyl alcohol liquid constituting the surface protection layer 28 is preferably executed while the fluid 32B remains on the surface of the multilayered wire structure portion 26.

For example, when pure water or the mixture of pure water and air is used as the jet 32B, the coating of the polyvinyl alcohol liquid to form the surface protection layer 28 is preferably executed before the surface of the multilayered wire structure portion 26 is perfectly dried, that is, within five seconds after the injection of the fluid 32B is finished.

As described above, the grooving processing based on the laser beam is executed on the multilayered wire structure portion 26 in the scribe area 21S, whereby the multilayered wire structure portion 26 is removed from the scribe area 21S to expose the surface of the semiconductor substrate 21.

At this time, the semiconductor substrate 21 except for the scribe area 21S is protected by the PVA film 28 having a uniform thickness. Therefore, even when fractions or sublimated materials which occur during the grooving process based on the laser beam are hardened, the multilayered wire structure portion 26 is not damaged.

The removal of the surface protection layer 28 may be executed by spraying fluid 32B' in the spin coating apparatus 132. Accordingly, it is unnecessary to provide another apparatus to remove the surface protection layer 28.

Thereafter, the dicing treatment using the dicing blade is executed on the scribe area of the semiconductor substrate 21, and the semiconductor substrate 21 is divided into individual semiconductor elements.

The semiconductor substrate manufacturing method is not limited to the dicing technique processing of the semiconductor substrate, and it may be applied to a case where perforation processing is applied to a desired area of the semiconductor substrate, etc.

Furthermore, in the foregoing description, the polyvinyl alcohol film is applied as the surface protection layer 28. However, if it has a water-soluble property, various kinds of additive agent may be added to the polyvinyl alcohol film.

The semiconductor manufacturing method is described by using as an example the manufacturing process of the semiconductor device in which the multilayered wire structure portion is formed on the silicon substrate, however, the substrate to be treated is not limited to the silicon substrate. The substrate to be treated may be a semiconductor element using a compound semiconductor substrate such as gallium arsenide (GaAs) or the like, an insulating substrate, a glass substrate or the like.

Furthermore, in this embodiment, the selective removal of the multilayered wire structure portion after the surface protection layer is formed is carried out by the grooving processing based on the laser beam. However, in place of the laser beam, an electron beam, an ion beam or other energy beams may be applied.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing a semiconductor device comprising steps of:
    spraying fluid in the form of a jet onto a surface of a treatment target substrate including a semiconductor substrate so as to wash the treatment target substrate;
    forming a protection layer on the surface of the treatment target substrate after spraying the fluid;
    selectively removing the protection layer and a part of the treatment target substrate by an energy beam; and
    conducting removing processing on an area of the treatment target substrate from which the protection layer and the part of the treatment target substrate are selectively removed,
    wherein the fluid is the same material as the protection layer in lower concentration than the concentration used in the step of forming the protection layer.

2. The method of manufacturing the semiconductor device according to claim 1, further comprising a step of removing the protection film remaining on the treatment target substrate after selectively removing the protection layer and the part of the treatment target substrate.

3. The method of manufacturing the semiconductor device according to claim 1, wherein the treatment target substrate includes a circuit layer formed on a surface of the semiconductor substrate, and the circuit layer is removed in the step of selectively removing the protection film and the part of the treatment target substrate.

4. The method of manufacturing the semiconductor device according to claim 1, wherein in the step of spraying the fluid, jet of water is applied to the surface of the treatment target substrate.

5. The method of manufacturing the semiconductor substrate according to claim 1, wherein in the step of spraying the fluid, jet of a mixture of water and air is applied to the surface of the treatment target substrate.

6. The method of manufacturing the semiconductor device according to claim 1, wherein the step of forming the protection layer is executed in the state that the fluid is remaining on the surface of the treatment target substrate.

7. The method of manufacturing the semiconductor device according to claim 1, wherein the selection removal of the protection layer and a part of the treatment target substrate is executed on a scribe area formed in the treatment target substrate.

8. The method of manufacturing semiconductor device according to claim 7, further comprising a step of dicing the treatment target substrate in the scribe area after selectively removing the protection layer and the part of the treatment target substrate.

9. The method of the manufacturing semiconductor device according to claim 1, wherein the protection layer includes a polyvinyl alcohol, and a material including the polyvinyl alcohol is spin-coated in the step of forming the protection layer.

10. The method of manufacturing the semiconductor device according to claim 1, wherein the energy beam is a laser beam.

11. The method of manufacturing the semiconductor device according to claim 2, wherein the step of removing the protection layer remaining on the surface of the treatment target substrate is executed in an apparatus same as an apparatus for executing the step of spraying the fluid.

12. The method of manufacturing the semiconductor device according to claim 2, wherein in the step of removing the protection film remaining on the surface of the treatment target substrate, fluid is sprayed to the protection film.

13. The method of manufacturing the semiconductor device according to claim 12, wherein the fluid sprayed to the protection film is same as the fluid sprayed to the surface of the treatment target substrate before the protection film is formed.

14. The method of the manufacturing semiconductor device according to claim 1, wherein the protection film is formed to be a uniform thickness.

* * * * *